United States Patent
Zheng

(10) Patent No.: US 7,859,040 B2
(45) Date of Patent: Dec. 28, 2010

(54) NON-VOLATILE MEMORY

(75) Inventor: Jun Zheng, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 272 days.

(21) Appl. No.: 12/170,553

(22) Filed: Jul. 10, 2008

(65) Prior Publication Data
US 2010/0006916 A1   Jan. 14, 2010

(51) Int. Cl.
*H01L 29/76* (2006.01)
(52) U.S. Cl. ............... 257/314; 257/315; 257/316; 257/E21.179; 257/E21.422; 438/201; 438/591
(58) Field of Classification Search ............ 257/239, 257/314, 315, 316, E29.129, E21.422, E21.68, 257/E21.687, E21.688, E29.3, E21.179; 438/201, 438/211, 257, 593, 591
See application file for complete search history.

(56) References Cited

U.S. PATENT DOCUMENTS

| 6,912,158 | B2 * | 6/2005 | Forbes ............. 365/185.18 |
| 7,579,646 | B2 * | 8/2009 | Wang et al. ............. 257/314 |
| 2003/0042531 | A1 | 3/2003 | Lee |
| 2006/0001073 | A1 | 1/2006 | Chen |
| 2006/0051920 | A1 * | 3/2006 | Yamaguchi et al. ......... 438/257 |

OTHER PUBLICATIONS

NN9111238 "Vacuum Sealed Silicon Rich Oxide EEPROM Cell", IBM Technical Disclosure Bulletin, Nov. 1991.*
Singh et al., Enhanced Cold Field Emission from <100> Oriented B-W Nanoemitters, J. Vac. Sci. Technolo. B 22(3), May/Jun. 2004.
Geis, et al., Electron Field Emission from Diamond and Other Carbon Materials After $H_2$, $O_2$, and Cs Treatment, Appl. Phys. Lett. 67 (9), Aug. 28, 1995.
Lisovskiy, et al., Low-Pressure Gas Breakdown in Uniform DC Electric Field, J. Phys. D: Appl. Phys. 33 (2000) 2722-2730.

* cited by examiner

*Primary Examiner*—Khiem D Nguyen
(74) *Attorney, Agent, or Firm*—Campbell Nelson Whipps

(57) ABSTRACT

Non-volatile memory is described. The non-volatile memory includes a substrate having a source region, a drain region and a channel region. The channel region separates the source region and the drain region. An electrically insulating layer is adjacent to the source region, drain region and channel region. A floating gate electrode is adjacent to the electrically insulating layer. The electrically insulating layer separates the floating gate electrode from the channel region. The floating gate electrode has a floating gate major surface. A control gate electrode has a control gate major surface and the control gate major surface opposes the floating gate major surface. A vacuum layer or gas layer at least partially separates the control gate major surface from the floating gate major surface.

14 Claims, 4 Drawing Sheets

NON-VOLATILE MEMORY

BACKGROUND

Field-effect transistors (FET) has been considered to be an ideal technology for nonvolatile memory because of its random access, high speed, low power, high density and simplicity. For a nonvolatile semiconductor storage device in which each memory cell is composed of an FET provided with a floating gate covered by an insulating film and used as a charge storing layer, data is stored by controlling the amount of electrons stored in the floating gate thereby changing the threshold voltage of the transistor. When programming or erasing data into or from the memory cell, electrons are either injected or ejected from the floating gate via the insulating film.

Electron injection/ejection is possible by using the (Fowler-Nordheim (F-N)) tunnel phenomenon and the hot electron phenomenon. Electrons are injected in the insulating film around the floating gate with the application of a high electrical field. Consequently, when the number of program/erase cycles is increased, the insulating film receives an electron injection stress repetitively, thereby degrading the insulating film.

This results in the degradation of the various properties of the memory cell. Especially, when a low electrical field is applied to the insulating film that has been degraded due to such repetitive program/erase operations, the leakage current (low electric field leakage current or stress-induced leakage current) is increased. Consequently, the electron retention characteristics or the disturb characteristics of the memory cell are degraded. This degradation has now been questioned as a factor to limit the program/erase cycles for such a nonvolatile semiconductor memory device.

It is known that many charged trapping centers are formed in the gate insulating film depending on the program/erase operation method if the program/erase operation is repeated. When electrons pass through the insulating film during program/erase operation, some of the electrons are trapped by those charged trapping centers. Those trapped electrons leak more easily out of the insulating film than the electrons stored in the floating gate. The threshold voltage of the memory cell is thus varied sharply and quickly after a program/erase operation, thereby affecting the data retention characteristics.

BRIEF SUMMARY

The present disclosure relates to non-volatile memory. In particular, the present disclosure relates to non-volatile memory that includes a vacuum or gas layer within the gate stack structure and functions by electron field emission or gas breakdown. These non-volatile memory units have a number of advantages including, for example, an improved lifetime, faster writing speed, and/or higher data storage density.

In illustrative embodiments, non-volatile memory includes a substrate having a source region, a drain region and a channel region. The channel region separates the source region and the drain region. An electrically insulating layer is adjacent to the source region, drain region and channel region. A floating gate electrode is adjacent to the electrically insulating layer. The electrically insulating layer separates the floating gate electrode from the channel region. The floating gate electrode has a floating gate major surface. A control gate electrode has a control gate major surface and the control gate major surface opposes the floating gate major surface. A vacuum layer or gas layer at least partially separates the control gate major surface from the floating gate major surface

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to non-volatile memory. In particular, the present disclosure relates to non-volatile memory that includes a vacuum or gas layer within the gate stack structure and functions by electron field emission or gas breakdown. These non-volatile memory units have a number of advantages including, for example, an improved lifetime, faster writing speed, and/or higher data storage density. While the present disclosure is not so limited, an appreciation of various aspects of the disclosure will be gained through a discussion of the examples provided below.

Figure 1:
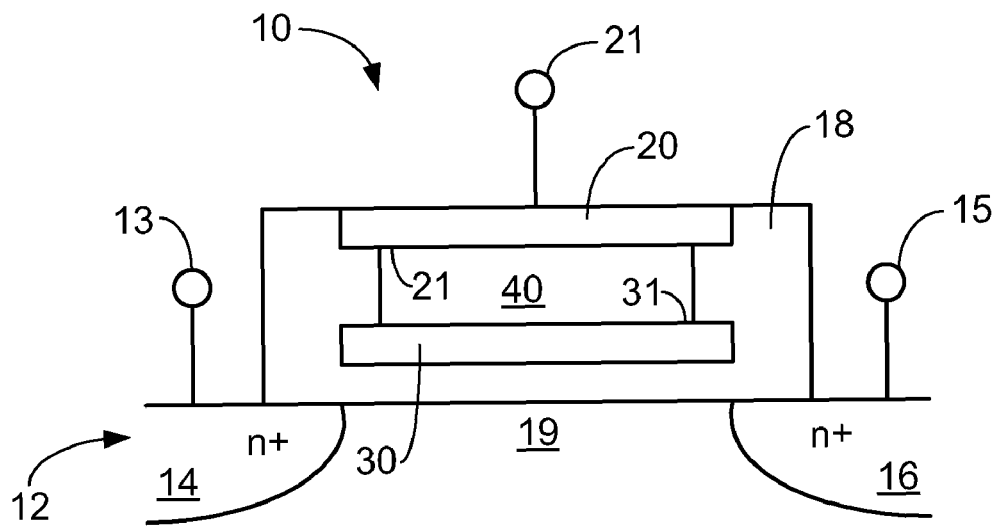
FIG. 1 is a cross-sectional schematic diagram of an illustrative memory unit.

FIG. 1 is a cross-sectional schematic diagram of an illustrative memory unit 10. The memory unit 10 includes a substrate 12 having a source region 14, a drain region 16 and a channel region 19 between or separating the source region 14 from the drain region 16. An electrically insulating layer 18 is adjacent to the substrate 12. A floating gate electrode 30 is adjacent to the electrically insulating layer 18 and the electrically insulating layer 18 separates the floating gate electrode 30 from the channel region 19. The floating gate electrode 30 includes a major surface 31. A control gate electrode 20 is within the memory unit 10. The control gate electrode 20 includes a major surface 21. The control gate major surface 21 opposes the floating gate major surface 31. A vacuum or gas layer 40 separates at least a portion of the floating gate electrode 30 from the control gate electrode 20.

It is understood that the memory unit 10 can have other configurations in addition to the illustrated configuration. For example, the memory unit 10 can be described as having a FINFET configuration. Materials forming the floating gate electrode 30 can be any useful charge storing material such as, for example, silicon nitride. Materials forming the electrically insulating layer 18 can be any useful electrically insulating material such as, for example, silicon oxide. Materials forming the control gate electrode 20 can be any useful electrically conducting material such as, for example, a metal or polysilicon.

The insulating layer 18 can enclose the vacuum or gas layer 40 between the control gate major surface 21 and the floating gate major surface 31. The insulating layer 18 can be formed of any useful electrically insulating material. In many embodiments, the insulating layer 18 is formed of an oxide material. The insulating layer 18 can have any useful thickness separating the floating gate electrode 30 from the substrate 12. Since electrons do not pass through the insulating layer 18 this layer can be thinner than conventional gate oxide layers. In many embodiments, the thickness of the insulating layer 18 separating the floating gate electrode 30 from the substrate 12 is in a range from 1 to 5 nm, or from 1 to 3 nm.

Both the floating gate electrode 30 and the control gate electrode 20 can have any useful thickness. Since electrons do not pass between, but not through, the floating gate electrode 30 and the control gate electrode 20, these layers 20 and 30 can be thicker than conventional layers 20 and 30. In many embodiments, the thickness of these layers 20 and 30 is in a range from 50 to 500 nm, or from 100 to 250 nm.

The control gate electrode 20 can be electrically coupled to a gate voltage source 21. The source region 14 can be electrically coupled to a source region voltage source 13 or to ground. The drain region 16 can be electrically coupled to a drain region voltage source 15 or to ground. In many embodiments, these connections can be facilitated in any useful manner such as, for example, via bit lines and/or word lines of the memory device array.

The substrate can be formed of any useful semiconductor material where the source region 14 and a drain region 16 are doped with the appropriate n or p dopant. The illustrated embodiment has the source region 14 and a drain region 16 is doped with an n dopant, however the disclosure is not limited to this. Although not shown, memory units 10 can be arranged in a matrix to form a memory array.

The vacuum or gas layer 40 can separate the floating gate electrode 30 from the control gate electrode 20 any useful distance. In many embodiments, this thickness value of the vacuum or gas layer 40 is in a range from 50 to 250 nm. In some embodiments, this thickness value of the vacuum or gas layer 40 is in a range from 50 to 150 nm.

In embodiments where the layer 40 is a vacuum layer, the pressure of this void space is reduced as much as possible. In many embodiments the vacuum layer has a pressure of 1000 Pa or less, or 100 Pa or less, or 10 Pa or less, or 1 Pa or less. The electron path for data storage is not through the insulating layer 18 (i.e., gate oxide layer), but through the vacuum layer via electron field emission between the floating gate electrode 30 and the control gate electrode 20.

In many embodiments, an electron field emitter element is on the floating gate electrode 30 and/or the control gate electrode 20 to improve the electron field emission characteristics. The electron field emitter element can be any useful electron field emitter element such as, for example, a carbon (e.g., diamond) based electron field emitter or a tungsten based electron field emitter element.

In embodiments where the layer 40 is a gas layer, the gas can be any useful gas present at any useful pressure to allow for electrons to migrate to the floating gate via gas breakdown. In many embodiments, the gas is an inert gas. Inert gases include, for example, argon, nitrogen, helium, neon, xeon, krypton, and the like. In some embodiments, the gas is a noble gas. Nobel gases include, for example, helium, neon, argon, krypton, xeon and radon.

In many embodiments the gas layer has a pressure in a range from 1 Pa to 500 Pa or higher. In some embodiments, the gas is a reactive gas such as, for example, oxygen, and/or air. The electron path for data storage is not through the insulating layer 18 (i.e., gate oxide layer), but from the gas in the gas layer via gas breakdown to the floating gate electrode 30.

Figure 2:
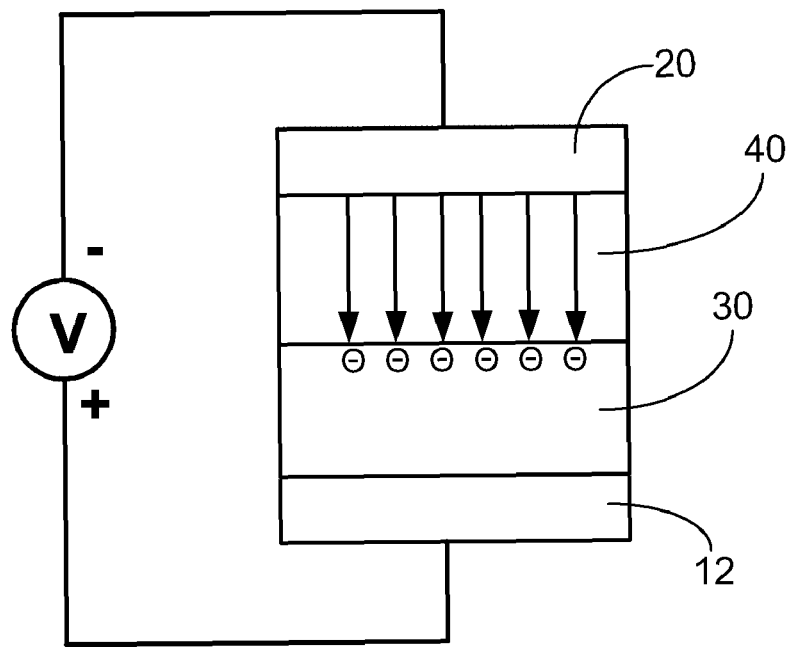
FIG. 2 is a schematic circuit diagram of an illustrative vacuum layer memory unit during a writing operation.

FIG. 2 is a schematic circuit diagram of an illustrative vacuum layer memory unit during a writing operation. A voltage source V applies a voltage of a first polarity across the floating gate electrode 30 and the control gate electrode 20. Application of the first polarity voltage V across the floating gate electrode 30 and the control gate electrode 20 moves electrons from the control gate electrode 20 through the vacuum layer 40 to the floating gate electrode 30 via electron field emission. The memory unit then can be described as being in a first data state (e.g., a "1" data state).

Figure 3:
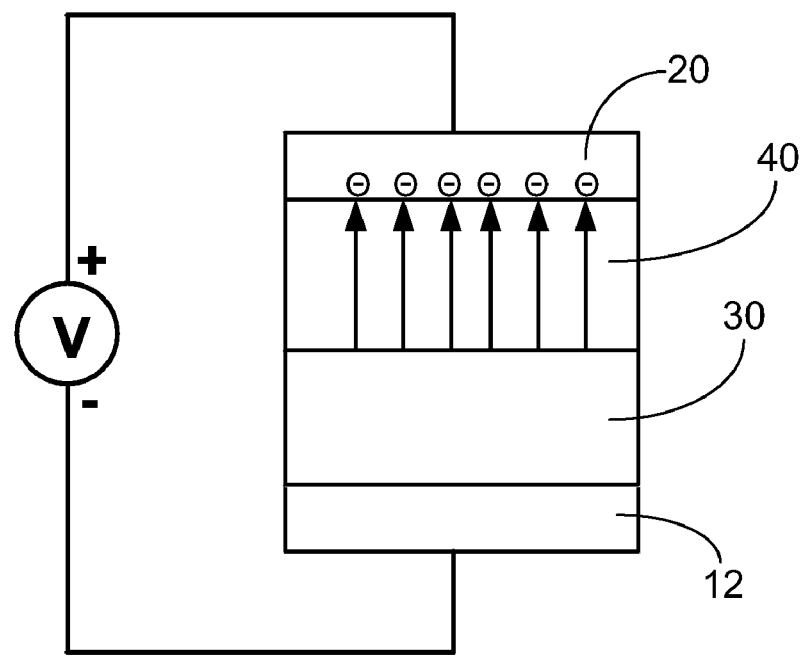
FIG. 3 is a schematic circuit diagram of an illustrative vacuum layer memory unit during a erase operation.

FIG. 3 is a schematic circuit diagram of an illustrative vacuum layer memory unit during a erase operation. A voltage source V applies a voltage of a second polarity across the floating gate electrode 30 and the control gate electrode 20. The second polarity voltage is an opposite polarity from the first polarity. Application of a second polarity voltage across the floating gate electrode 30 and the control gate electrode 20 moves electrons from the floating gate electrode 30 through the vacuum layer 40 to the control gate electrode 20 via electron field emission. The memory unit then can be described as being in a second data state (e.g., a "0" data state).

Figure 4:
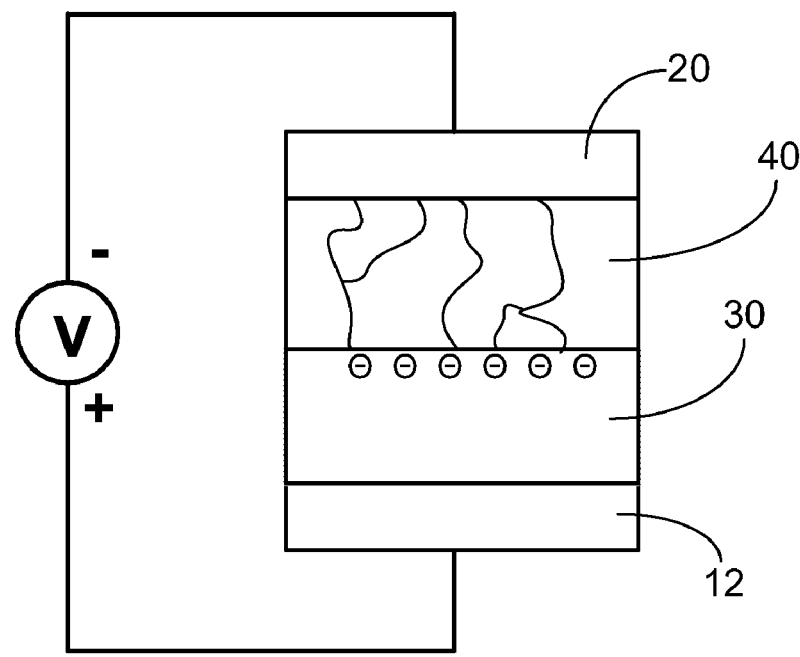
FIG. 4 is a schematic circuit diagram of an illustrative gas layer memory unit during a writing operation.

FIG. 4 is a schematic circuit diagram of an illustrative gas layer memory unit during a writing operation. A voltage source V applies a voltage of a first polarity across the floating gate electrode 30 and the control gate electrode 20. Application of the first polarity voltage V across the floating gate electrode 30 and the control gate electrode 20 moves electrons from the gas layer 40 to the floating gate electrode 30 via gas breakdown. The memory unit then can be described as being in a first data state (e.g., a "1" data state).

Figure 5:
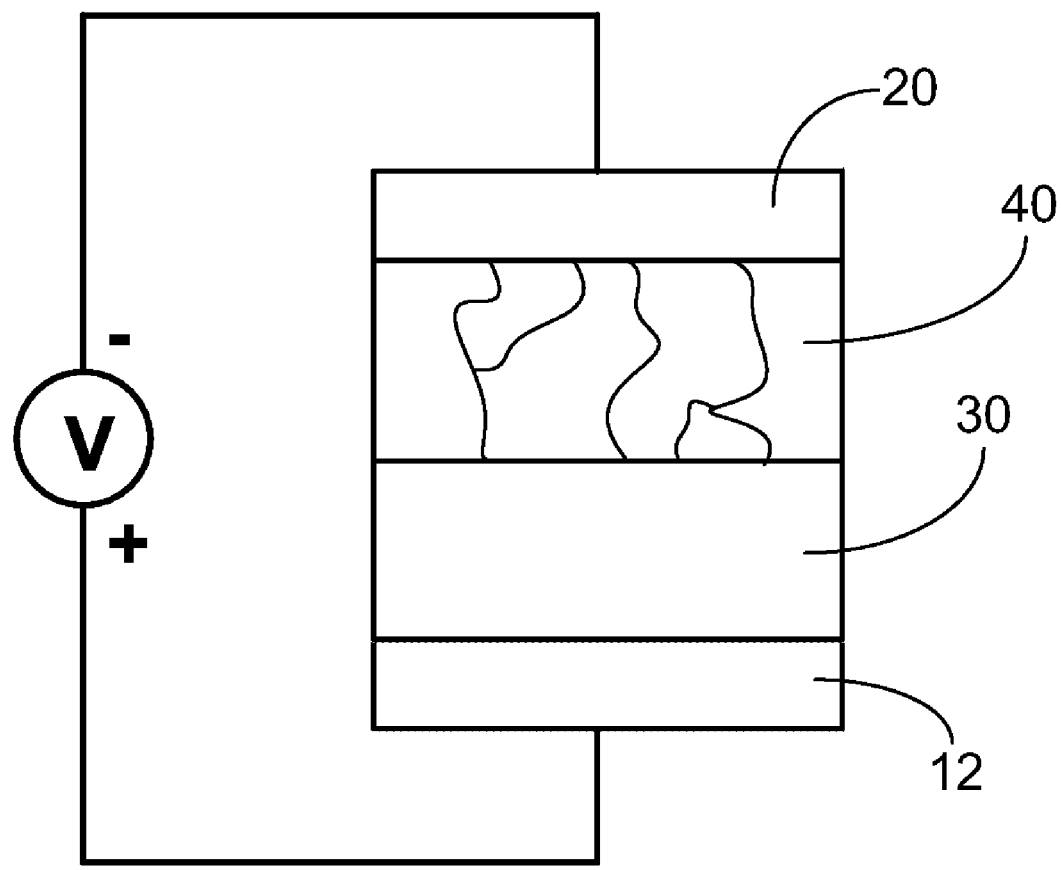
FIG. 5 is a schematic circuit diagram of an illustrative gas layer memory unit during a erase operation.

FIG. 5 is a schematic circuit diagram of an illustrative gas layer memory unit during a erase operation. A voltage source V applies a voltage of a second polarity across the floating gate electrode 30 and the control gate electrode 20. The second polarity voltage is an opposite polarity from the first polarity. Application of a second polarity voltage across the floating gate electrode 30 and the control gate electrode 20 moves electrons from the floating gate electrode 30 to the gas layer 40. The memory unit then can be described as being in a second data state (e.g., a "0" data state).

The memory units described herein are capable of multi-bit data storage capacity. The quantity of electrons stored in the floating gate layer is controllable by the applied voltage according to the following equation:

$$Q = \in A(U - E_b d_1)/d_2$$

where Q is the total charge on the floating gate electrode, $\in$ is the dielectric constant of the floating gate electrode, A is the area of the floating gate electrode, U is the applied external voltage, $E_b$ is the breakdown field in the gas or emission threshold for vacuum layer, $d_1$ is the thickness of the gas or vacuum layer, and $d_2$ is the thickness of the floating gate electrode. Thus, the amount of charge stored in the floating gate layer can be tuned by the applied external voltage. Therefore, more than two charge levels can be achieved in the memory units described herein, providing for multi-bit data storage capacity.

Figure 6A:
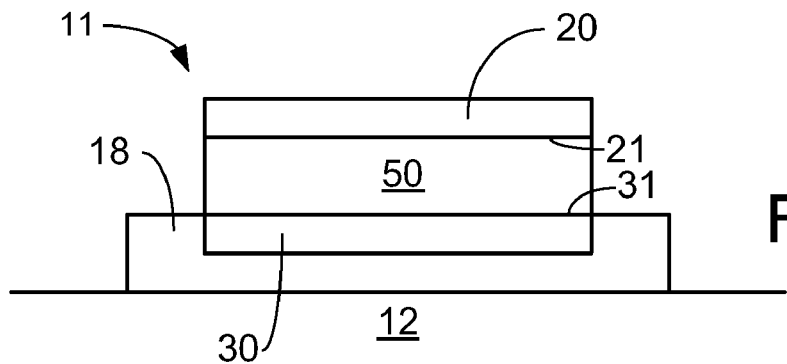
FIG. 6A-6D is a cross-sectional schematic diagram of a method of forming an illustrative memory unit.

FIG. 6A-6D is a cross-sectional schematic diagram of a method of forming an illustrative memory unit. FIG. 6A shows a floating gate structure 11 formed on a semiconductor substrate 12, as described above. An insulating layer 18 separates the floating gate structure 11 from a channel region of the substrate 12, as described above. The floating gate stack or structure 11 includes a sacrificial layer 50 separating a floating gate electrode 30 from a control gate electrode 20. The sacrificial layer 50 can be any material that is able to be selectively removed from the floating gate stack or structure 11. In many embodiments, the sacrificial layer 50 can be any material which could be wet/dry etched in isotropic manner, such as dielectrics (Si, SiO$_2$), polymer or metal.

Figure 6B:
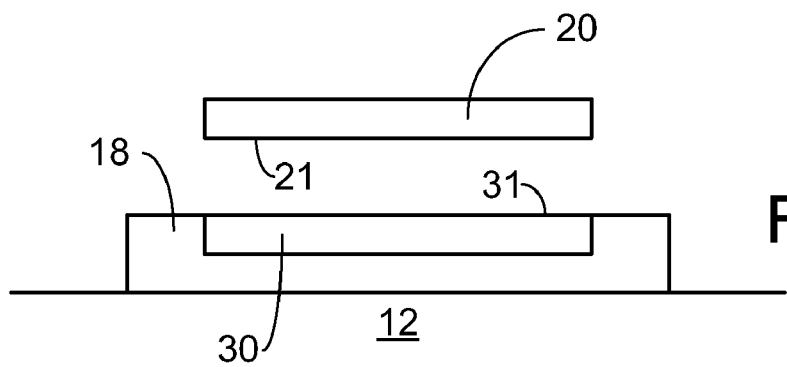

FIG. 6B illustrates the floating gate structure 11 with the sacrificial layer 50 removed or released to form a void space at least partially defined by major surface 31 of the floating gate electrode 30 and a major surface 21 of the control gate electrode 20. In many embodiments, this removal is accomplished via etching. The major surface 31 of the floating gate electrode 30 opposes the major surface 21 of the control gate electrode 20. The control gate electrode 20 can be held in place by any useful structure to allow the control gate electrode 20 to "cantilever" over the floating gate electrode 30 and create the void space. Then a vacuum or pressure of 1000 Pa or less 40 is created within the void or a gas 40 fills the void.

Figure 6C:
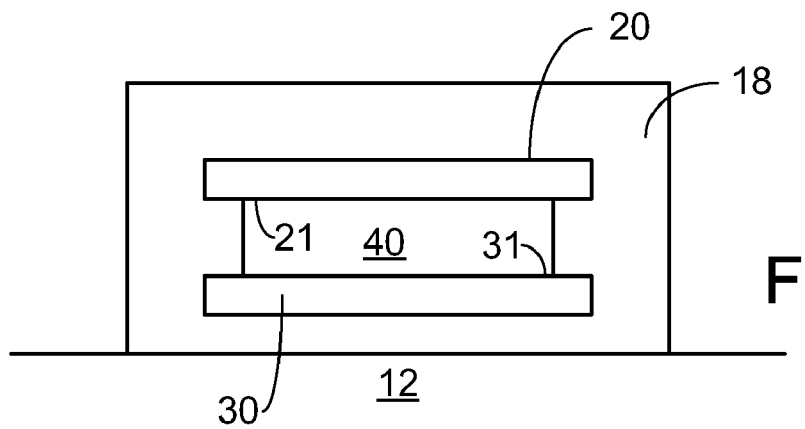

FIG. 6C illustrates sealing the vacuum or pressure of 1000 Pa or less 40 void space or gas 40 filled void space at least partially between the major surface 31 of the floating gate electrode 30 and the major surface 21 of the control gate electrode 20. In many embodiments the vacuum 40 void space or gas 40 filled void space is sealed by deposition of the insulating layer 18 about the floating gate structure 11 in a vacuum or particular gas environment. One example of this process for an argon gas 40 filled void space includes silicon oxide sputtering at 25 Pa argon pressure.

Figure 6D:
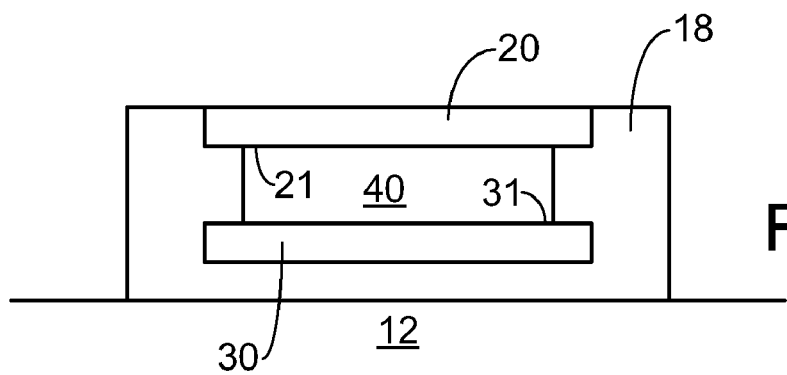

FIG. 6D illustrates an optional step of removing a portion of the oxide layer 18 to expose a surface of the control gate electrode 20. In many embodiments, this is accomplished by chemical mechanical polishing. Then electrical connections can be formed, as desired to form the non-volatile memory unit.

Thus, embodiments of the NON-VOLATILE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A non-volatile memory unit, comprising:
   a substrate having a source region, a drain region and a channel region, the channel region separates the source region and the drain region;
   an electrically insulating layer adjacent to the source region, drain region and channel region layer;
   a floating gate electrode adjacent to the electrically insulating layer, the electrically insulating layer separates the floating gate electrode from the channel region, the floating gate electrode having a floating gate major surface comprising a carbon based electron field emitter or a tungsten based field emitter;
   a control gate electrode having a control gate major surface comprising a carbon based electron field emitter or a tungsten based field emitter, the control gate major surface opposing the floating gate major surface; and
   a vacuum layer at least partially separating the control gate major surface from the floating gate major surface;
   wherein the electrically insulating layer has a thickness value in a range from 1 to 5 nm separating the floating gate electrode from the substrate.

2. A non-volatile memory unit according to claim 1, wherein the vacuum layer is a pressure of 1000 Pa or less.

3. A non-volatile memory unit according to claim 1, wherein the vacuum layer has a thickness value in a range from 50 nm to 250 nm.

4. A non-volatile memory unit according to claim 1, wherein electrons move between the control gate major surface and the floating gate major surface through the vacuum layer.

5. A non-volatile memory unit according to claim 1, wherein the control gate major surface and the floating gate major surface comprise a diamond based electron field emitter.

6. A non-volatile memory unit according to claim 1, wherein application of a first polarity voltage across the floating gate electrode and the control gate electrode moves electrons from the control gate electrode through the vacuum layer to the floating gate electrode.

7. A non-volatile memory unit according to claim 6, wherein application of a second polarity voltage across the floating gate electrode and the control gate electrode moves electrons from the floating gate electrode through the vacuum layer to the control gate electrode, the second polarity voltage is an opposite polarity from the first polarity.

8. A non-volatile memory unit, comprising:
   a substrate having a source region, a drain region and a channel region, the channel region separates the source region and the drain region;
   an electrically insulating layer adjacent to the source region, drain region and channel region;
   a floating gate electrode adjacent to the electrically insulating layer, the electrically insulating layer separates the floating gate electrode from the channel region, the floating gate electrode having a floating gate major surface comprising a carbon based electron field emitter or a tungsten based field emitter;
   a control gate electrode having a control gate major surface comprising a carbon based electron field emitter or a tungsten based field emitter, the control gate major surface opposing the floating gate major surface; and a gas layer at least partially separating the control gate electrode from the floating gate electrode;

wherein the electrically insulating layer has a thickness value in a range from 1 to 5 nm separating the floating gate electrode from the substrate.

9. A non-volatile memory unit according to claim 8, wherein the gas layer comprises an inert gas.

10. A non-volatile memory unit according to claim 8, wherein the gas layer comprises a noble gas.

11. A non-volatile memory unit according to claim 8, wherein the gas layer has a thickness value in a range from 50 nm to 250 nm.

12. A non-volatile memory unit according to claim 8, wherein electrons move between the gas layer and the floating gate major surface.

13. A non-volatile memory unit according to claim 8, wherein application of a first polarity voltage across the floating gate electrode and the control gate electrode moves electrons from the gas layer to the floating gate electrode.

14. A non-volatile memory unit according to claim 13, wherein application of a second polarity voltage across the floating gate electrode and the control gate electrode moves electrons from the floating gate electrode to the gas layer, the second polarity voltage is an opposite polarity from the first polarity.

* * * * *